United States Patent
Park et al.

(10) Patent No.: US 6,743,472 B2
(45) Date of Patent: Jun. 1, 2004

(54) COATING MATERIAL FOR ABSORBING RADIANT HEAT, MANUFACTURING METHOD THEREOF

(75) Inventors: Bong Mo Park, Gumi (KR); Ill Soo Choi, Gumi (KR)

(73) Assignee: Siltron Inc., Gumi (KR)

( * ) Notice: Subject to any disclaimer, the term of this patent is extended or adjusted under 35 U.S.C. 154(b) by 0 days.

(21) Appl. No.: 10/232,611

(22) Filed: Sep. 3, 2002

(65) Prior Publication Data

US 2003/0070585 A1 Apr. 17, 2003

(30) Foreign Application Priority Data

Aug. 31, 2001 (KR) .................................... 2001-0053103

(51) Int. Cl.[7] .............................................. C23C 16/00
(52) U.S. Cl. .............................. 427/248.1; 17/2; 17/3; 17/217; 17/218; 17/222
(58) Field of Search ................................. 117/217, 218, 117/222, 13; 427/248.1

(56) References Cited

U.S. PATENT DOCUMENTS

| | | | | |
|---|---|---|---|---|
| 5,441,014 A | * | 8/1995 | Tomioka et al. | ............... 117/13 |
| 6,117,402 A | * | 9/2000 | Kotooka et al. | ......... 422/245.1 |
| 6,340,391 B1 | * | 1/2002 | Iino et al. | ...................... 117/13 |
| 6,579,362 B2 | * | 6/2003 | Ferry et al. | .................. 117/208 |

* cited by examiner

Primary Examiner—Felisa Hiteshew
(74) Attorney, Agent, or Firm—Jacobson Holman PLLC

(57) ABSTRACT

Disclosed are a coating material for absorbing radiant heat, forming method thereof, a radiant heat cooling apparatus using the same, and an apparatus for growing a silicon single crystal using the same. The radiant heat absorbing coating material includes 10~15 wt/% of silica gel, 5~10 Wt/% of graphite powder, and 75~85 wt/% of IPA, and is formed by agitation. An ingot growing apparatus includes a quartz crucible, a heating element, a crystal pulling device, a heat shield for maintaining a constant temperature distribution in the crystal growing system, and a cooling device, wherein the quartz crucible, heating element, crystal pulling device, heat shield, and cooling device are installed inside a sealed furnace or a sealed crystal growing apparatus, wherein the silicon single crystal growing apparatus further comprises a crystal cooling means for cooling the growing crystal by absorbing radiant heat radiating from the silicon crystal, and wherein the crystal cooling means includes a circulating cooling pipe inside and an ingot radiant heat absorbing layer coated on an outer surface of the cooling means.

6 Claims, 2 Drawing Sheets

COATING MATERIAL FOR ABSORBING RADIANT HEAT, MANUFACTURING METHOD THEREOF

BACKGROUND OF THE INVENTION

1. Field of the Invention

The present invention is directed to the field of growing bulk semiconductor crystals from silicon melts by the Czochralski method. More particularly, this invention relates to a coating material for absorbing radiant heat emitted from the crystal, a manufacturing method thereof, a cooling apparatus coated with the same material, and a crystal growing system for producing silicon crystals using the apparatus enabling to improve pulling speed and cooling rates of the crystal by dissipating the radiant heat emitted from the crystal effectively outside so as to improve productivity and quality of the crystal.

2. Background of the Related Art

In order to cope with the increasing demands for semiconductor fabrication, quality requirements for a silicon wafer become continuously stricter.

When a silicon single crystal is grown by the Czochralski (CZ) method, the cooling rate of the crystal has great influence on formation of grown-in defects, Hence, in the process of growing the silicon crystal, productivity improvement and effective control of the defects are discriminating factors.

FIG.1 illustrates the diagrammatic path of heat flow in a crystal growing apparatus during the silicon crystal growth. In equilibrium state, heat balance quation during the silicon crystal growth can be expressed as follows.

Heat Balance: QR=QC=QL+QM, where QR, QC, QL and QM are the total amount of heat emitted from crystal surface per unit time, the amount of heat conducted by crystal per unit time, the amount of latent heat of crystallization per unit time, and the amount of heat transferred from melt to crystal per unit time, respectively.

Crystal pulling speed $V=(K_s G_s A-K_L G_L A)/(\blacktriangledown S_L A) = (Q_R-K_L G_L A)(\blacktriangledown S_L A)$, where V, $K_S$, $G_S$, $K_L$, $G_L$, $\blacktriangledown$, and $S_L$ are the crystal puling speed, thermal conductivity the crystal, the temperature gradient in the crystal near the crystallization interface, the density of the crystal, and latent heat of crystallization(per unit mass), respectively.

Therefore, the crystal pulling speed(V) depends exceedingly on the temperature gradients in the crystal and the melt.

The conventional technique has normally used a method of inserting heat shield between the melt and the crystal to increase the temperature gradient in the crystal near the interface of crystallization. Yet, the temperature gradient rise in the crystal by such a technique has a technical limitation.

The inner wall of the crystal growing furnace, which play a role of absorbing and dissipating radiant heat in the crystal growing system is made of a metal based material having low emissivity such as stainless steel, thereby failing to receive effectively radiant heat emitted from the crystal. Thus, the radiant heat is reflected to the crystal again, thereby having technical barrier in increasing the cooling rate of the crystal.

In order to increase the emissivity, the inner wall of the furnace should be formed of a material having high emissivity. However, such a material having high emissivity and satisfing strict requirements for application to the crystal growing furnace, has not been found yet. A method of coating on an inner wall of the crystal growing furnace with a material having high emissivity can be considered. However, such a coating material, which enables to overcome thermal stress caused by the difference of thermal expansion coefficient between a coated surface and a coating material in a wide temperature range from the room temperature to the high-temperature (~1,000 C.) and to adhere strongly to stainless steel, has not been found so far.

SUMMARY OF THE INVENTION

Therefore, the present invention is directed to a coating material for absorbing radiant heat, a forming method thereof, a radiant heat cooling apparatus using the same, and an apparatus for growing silicon single crystals using the same that substantially obviate one or more problems due to the limitations and disadvantages of the conventional art.

An object of the present invention is to provide a coating material enabling to adhere strongly to stainless steel in a wide temperature range from between the room temperature to the high-temperature region(~1,000 C.) as well as have high emissivity.

The coating material according to the present invention includes a silica matrix and graphite power having a high emissivity, and is economically applicable to mass production.

Another object of the present invention is to provide a method of forming a coating material enabling to adhere strongly to stainless steel in a wide temperature range from the room temperature to the high-temperature region(~1,000 C.) as well as have high emissivity.

A further object of the present invention is to provide an apparatus for growing silicon single crystals enabling to increase the productivity of crystal growing by cooling the crystal at a great rate by absorbing effectively radiant heat emitted from the crystal.

Another further object of the present invention is to provide a radiant heat cooling apparatus enabling to improve a crystal cooling rate by maximizing heat dissipation effect by means of absorbing effectively radiant heat emitted from the crystal Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages in accordance with the purpose of the invention, as embodied and described herein, a radiant heat absorbing coating material according to the present invention includes 10~15 wt/% of silica, 5~10 Wt/% of graphite power, and 75~85 wt/% of IPA(isopropyl alcohol).

Preferably, the IPA is volatilized by drying and particles of the graphite powder are disributed homogeneously in the silica matrix and attached to the stainless steel material together with silica.

In another aspect of the present invention, a method of forming a radiant heat absorbing coating material includes the step of agitating to mix 10~15 wt/% of silica gel, 5~10 Wt/% of graphite powder, and 75~85 wt/% of IPA(isopropyl alcohol).

In a further aspect of the present invention, in the crystal growing apparatus for growing silicon single crystals from the silicon melts, the silicon single crystal growing apparatus comprises a quartz crucible, a heating element, a crystal pulling device, a heat shield for maintaining a proper temperature distribution in the crystal growing system, and a cooling device, wherein the quartz crucible, heating element, crystal pulling device, heat shield, and cooling apparatus are installed inside a sealed furnace or a sealed crystal growing apparatus, wherein the silicon single crystal growing apparatus further comprises the crystal cooling apparatus for cooling the crystal during the crystal growth by absorbing radiant heat emitted from the crystal, and wherein the crystal cooling apparatus includes a circulating cooling pipe inside and a radiant heat absorbing layer coated on the surface of the cooling instrument.

Preferably, the cooling apparatus is made of stainless steel and wherein the radiant heat absorbing layer is formed by coating a radiant heat absorbing coating material on the surface of the instrument, which is prepared by agitating to mix 10~15 wt/% of silica gel, 5~10 Wt/% of graphite powder, and 75~85 wt/% of IPA, thereon, drying the coated radiant heat absorbing coating material, carrying out low-temperature sintering thereon.

In another further aspect of the present invention, in a cooling apparatus for absorbing radiant heat for transfering heat outside the crystal growing apparatus or furnace, a radiant heat cooling apparatus includes a circulating cooling pipe inside and a radiant heat absorbing layer coated on the surface of the cooling apparatus, wherein the radiant heat absorbing layer is formed by coating a radiant heat absorbing coating material, which is prepared by agitating to mix 10~15 wt/% of silica gel, 5~10 Wt/% of graphite powder, and 75~85 wt/% of IPA, thereon and drying the coating material.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute the part of this application, illustrate embodiment(s) of the invention and together with the description serve the explanation of the principle of the invention. In the drawings.

DETAILED DESCRIPTION OF THE PREFERRED EMBODIMENTS

Figure 1:
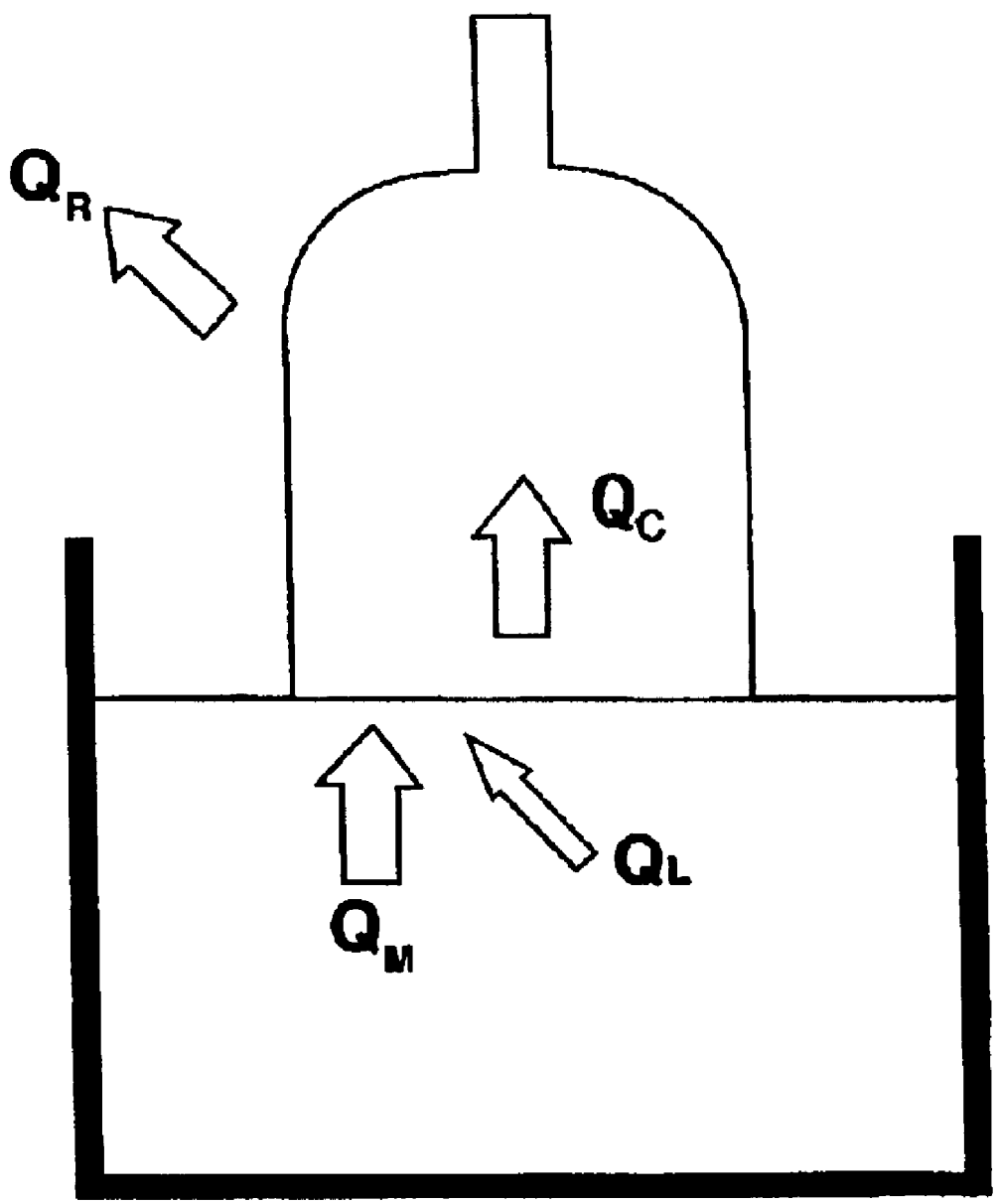
FIG. 1 illustrates a diagrammtic path of heat flow and the heat balance in the crystal growing system during the crystal growth.

Reference will now be made in detail about the preferred embodiments of the present invention, examples of which are illustrated in the accompanying drawings.

A coating material for absorbing radiant heat according to the present invention includes 10~15 wt/% of silica gel, 5~10 Wt/% of graphite powder, and 75~85 wt/% of IPA (isopropyl alcohol).

Materials used in the present invention are silica($SiO_2$) gel, graphite powder, and IPA.

Silica has a granularity distribution of 5~30nm in the form of a gel state and the properties of strong heat-resistance and adhesion to a metal based material. Silica in the form of amorphous state enables to adhere strongly to stainless steel in a wide temperature range from the room temperature to high temperature(~1,000℃), and includes a silica matrix having graphite particles contained uniformly inside so that the coating layer have a high emissivity.

Graphite powder, which has at least 99.99% of purity and a granularity distribution under 10▼m, is used so as to be distributed in the silica matrix uniformly. Hence, graphite enables to form a black coloured coating layer having a high absorption capability.

The outer part of crystal growing apparatus is generally made of a metal based material having low emissivity such as stainless steel, since the coating layer having high emissivity is formed so as not to reflect the radiant heat to the growing crystal again thereon. In order that radiant heat emitted from the crystal is not reflected to the growing crystal, the black coloured material is coated thereon so as to maximize the absorption of the radiant heat. Hence, the present invention uses black coloured graphite powder having high emissivity.

IPA is used as a solvent in which silica gel and graphite powder are mixed well with each other. IPA helps the silica and graphite be mixed well with each other and the coating material of the present invention be coated with easy thereon. Moreover, IPA having a strong volatility is evaporated after coating so as to fail to remain on the coating layer.

There are various methods of performing the coating process using IPA. Namely, the coating process can be carried out by coating using a brush or a sprayer, dipping using a vessel, or the like. Each of the methods is applicable effectively in accordance with a coating area or a part size.

Components of the silica and graphite powder forming the coating layer finally are equivalent to those of insulation materials, raw materials, and the like used for silicon crystal growth according to the CZ method, thereby enabling to exclude the possibility of additional contamination as well as haveing sufficient heat resistance. Hence, the silica and graphite of the present invention can be directly applied to the current mass production process.

A method of forming a coating material for absorbing radiant heat according to the present invention is explained in detail as follows.

First of all, 10~15 wt/% of silica gel, 5~10 Wt/% of graphite powder, and 75~85 wt/% of IPA(isopropyl alcohol) are prepared.

The prepared materials are put in a vessel to be mixed so as to become a mixed solution. The mixing is carried out in a manner that the materials are put in an agitator, and then are stirred mechanically for a predetermined time, or the materials for small quantity are put in a sealed vessel, and then are shaken well.

Application of the coating material according to the present invention is carried out in the following manner.

First of all, the coating material according to the present invention is coated on the surface to be coated, and is then dried naturally or by heating so as to form a radiant-heat absorbing layer. After the natural dryness, the radiant-heat absorbing layer is heated at a temperature of about 300 C. so as to remove structural water therefrom. The silica gel is sintered at a low temperature so as to be coated on the coating face strongly in the form of amorphous silica.

A thickness of the radiant heat absorbing layer is variable in accordance with the number of coating times, and is preferably 10~1,000▼m.

The mixed coating material according to the present invention is coated on an inner wall of the upper part of a crystal growing apparatus or a partial/entire inner wall of the crystal cooling apparatus, and dried, and then sintered at a low temperature so as to form a black coloured radiant heat absorbing layer as a state of amorphous.

After coating, IPA included in the coating material is removed completely so as to fail to remain in the coating layer.

The radiant heat absorbing layer according to the present invention is formed black in colour to have a high emissivity, and helps to absorb dramatically radiant heat emitted from a crystal during the crystal growth so as to contribute to increase of the cooling rate of the crystal.

An embodiment of using the coating material according to the present invention is explained by referring to FIG. 2 as follows.

Figure 2:
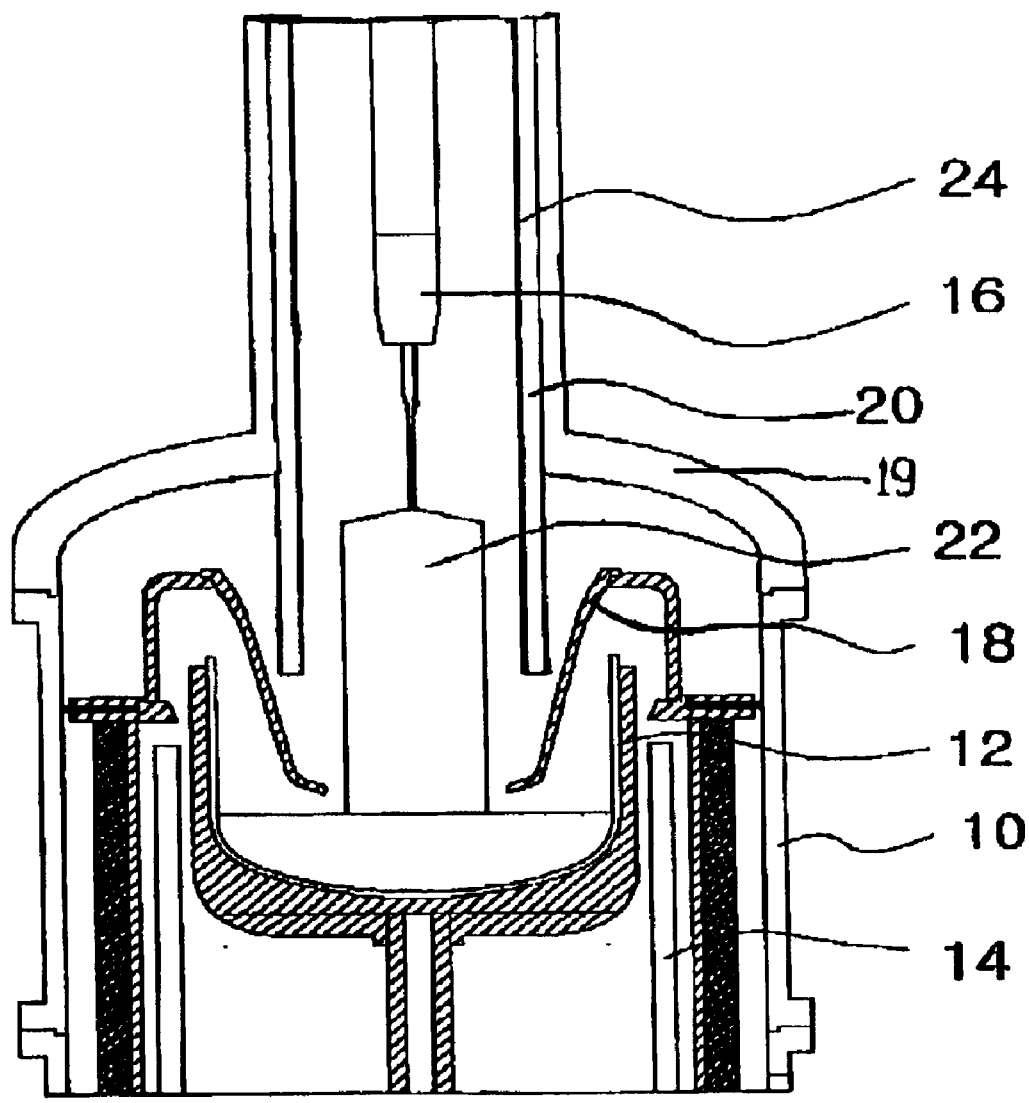
FIG. 2 illustrates a cross-sectional view of the middle part of the crystal growing apparatus to which a coating material according to the present invention is applied.

FIG. 2 illustrates a cross-sectional view of the middle part of a crystal growing apparatus to which a coating material according to the present invention is applied, in which an upper part having a crystal pulling device, a crucible driving unit, a control unit, a power unit, a leg part having a base and the like are skipped.

A silicon single crystal growing apparatus according to the present invention is explained as follows.

A silicon single crystal growing apparatus makes a silicon single crystal grow from silicon melt, and includes, in a furnace 10 or a crystalline growing apparatus having a vacuum state inside, a quartz crucible 12, a heating element 14, a crystal pulling device 16, a heat shield 18 for maintaining a proper temperature distribution in the system, and a cooling device 19 as a portion of the furnace 10 or crystal growing apparatus so as to cool the crystal as well. And, the silicon single crystal growing apparatus further includes a crystal cooling instrument for cooling the growing crystal 22 by absorbing radiant heat emitted from the silicon crystal.

In this case, the crystal cooling means has a circulating cooling pipe 20 inside, and includes radiant heat absorbing layer 24 coated on the surface of the cooling means 20.

Moreover, the cooling means 20 is made of metal such as stainless steel. And, the radiant heat absorbing layer 24 is formed by coating a radiant heat absorbing coating material, which is prepared by agitating to mis 10~15 wt/% of silica gel, 5~10 Wt/% of graphite powder, and 75~85 wt/% of IPA with each other, thereon, drying the coated radiant heat absorbing coating material, carrying out low-temperature sintering thereon.

In the drying process, IPA in the radiant heat absorbing coating material volatilizes so as to fail to remain in the radiant heat absorbing layer 24. Graphite run particles are distributed uniformly in the silica matrix, and the silica in the form of a amorphous is attached strongly to stainless steel. Therefore, the radiant heat absorbing layer is attached strongly to the surface of the cooling means.

A radiant heat absorbing apparatus coated with the coating material according to the present invention includes a radiant heat absorbing layer 24 for absorbing radiant heat and a cooling means 20 installed so as to dissipate the absorbed radiant heat outside. And, the radiant heat absorbing layer 24 is formed by coating a radiant heat absorbing coating material, which is prepared by agitating to mix 10~15 wt/% of silica gel, 5~10 Wt/% of graphite powder, and 75~85 wt/% of IPA with each other, thereon and drying the coated radiant heat absorbing coating material. In the drying process, IPA in the radiant heat absorbing coating material volatilizes so as to fail to remain in the radiant heat absorbing layer 24.

Accordingly, the black coloured coating material formed by the method of the present invention helps to absorb radiant heat emitted from the growing crystal, thereby improve the cooling speed.

Moreover, the materials used as the coating material are equivalent to insulation materials, raw materials, and the like, thereby enabling to exclude the possibility of additional contamination. And, the materials used as the coating material have sufficient heat tolerance in a wide temperature range from the room temperature to 1,000 C., thereby being suitable for the use of the silicon crystal growing apparatus, etc. in high temperature.

Besides, the coating material according to the present invention is economically applicable to mass production with ease, and can be directly put into the current process of mass production.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A radiant heat-absorbing a coating material-comprising:
   10~15 wt/% of silica gel;
   5~10 Wt/% of graphite powder; and
   75~85 wt/% of IPA(isopropyl alcohol).

2. The radiant heat absorbing coating material of claim 1, wherein/the IPA is volatilized by drying and particles of the graphite are distributed homogeneously in a silica matrix.

3. A method of forming a radiant radiant heat absorbing coating material, comprising the step of agitating to mix 10~15 wt/% of silica gel, 5~10 Wt/% of graphite power, and 75~85 wt/% of IPA(isopropyl alcohol) with each other.

4. A crystal growing apparatus for growing silicon single crystals from silicon melt, a silicon single crystal growing apparatus comprising:
   a quartz crucible;
   a heating element;
   a crystal pulling device;
   a heat shield for maintaining a proper temperature distribution in the crystal growing system; and
   a cooling device,
   wherein the quartz crucible, heating element, crystal pulling device, heat shield, and cooling device are installed inside a sealed furnace or a sealed crystal growing apparatus,
   wherein the silicon/crystal growing apparatus further comprises a crystal cooling means for cooling the growing crystal by absorbing radiant heat emitted from the crystal, and
   wherein the crystal cooling means includes a circulating cooling pipe inside and a crystal radiant heat absorbing layer coated on an outer surface of the cooling means.

5. The single silicon crystal growing apparatus of claim 4, wherein the cooling pipe is made of stainless steel and wherein the radiant heat absorbing layer is formed by coating a radiant heat absorbing coating material, which is prepared by agitating to mix 10~15 wt/% of silicia gel, 5~10 wt/% of graphite powder, and 75~85 wt/% of IPA(isopropyl alcohol) with each other, thereon, drying the coated radiant heat absorbing coating material, carrying out low-temperature sintering thereon.

6. A cooling apparatus for absorbing radiant heat emitted from the crystal and transferring heat outside the crystal growing apparatus or furnace, a radiant heat cooling apparatus comprising:

a circulating cooling pipe inside; and a radiant heat absorbing layer coated on an outer surface of the cooling means, wherein the radiant heat absorbing layer is formed by coating a radiant heat absorbing coating material, which is prepared by agitating to mix 10~15 wt/% of silica gel, 5~10 wt/% of graphite powder, and 75~85 wt/% of IPA(isopropyl alcohol) with each other, thereon and drying the coated radiant heat absorbing coating material.

* * * * *